United States Patent
Motai et al.

(10) Patent No.: US 12,183,782 B2
(45) Date of Patent: Dec. 31, 2024

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Takako Motai, Kanagawa (JP); Tomoko Matsudai, Tokyo (JP); Yoko Iwakaji, Tokyo (JP); Hiroko Itokazu, Kanagawa (JP); Kaori Fuse, Kanagawa (JP); Keiko Kawamura, Kanagawa (JP); Kohei Oasa, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 405 days.

(21) Appl. No.: 17/582,990

(22) Filed: Jan. 24, 2022

(65) Prior Publication Data
US 2023/0078785 A1     Mar. 16, 2023

(30) Foreign Application Priority Data
Sep. 15, 2021   (JP) .................................. 2021-150262

(51) Int. Cl.
*H01L 29/06*     (2006.01)
*H01L 29/739*    (2006.01)

(52) U.S. Cl.
CPC ...... *H01L 29/0626* (2013.01); *H01L 29/7397* (2013.01)

(58) Field of Classification Search
CPC ............. H01L 29/0626; H01L 29/7397; H01L 29/0696; H01L 29/1095; H01L 29/0619;
(Continued)

(56) References Cited

U.S. PATENT DOCUMENTS 6,667,515 B2 * 12/2003 Inoue .................. H01L 29/7802
                                                                 257/E29.066
9,773,923 B2    9/2017 Onozawa et al.
(Continued)

FOREIGN PATENT DOCUMENTS

JP    2002-343967 A    11/2002
JP    2011-086710 A     4/2011
(Continued)

OTHER PUBLICATIONS

Notice of Reasons for Refusal of corresponding Japanese Patent Application No. 2021-150262 issued on Jun. 20, 2024 in 10 pages.

*Primary Examiner* — Allison Bernstein
(74) *Attorney, Agent, or Firm* — Knobbe, Martens, Olson & Bear, LLP

(57) ABSTRACT

A semiconductor device includes a semiconductor part, first and second electrodes and a control electrode. The semiconductor part is provided between the first and second electrode. The semiconductor part includes first and third layers of a first conductivity type, and second, fourth and fifth layers of a second conductivity type. The first layer extends between the first and second electrodes. The second layer is provided between the first layer and the second electrode. The third semiconductor layer is provided between the second layer and the second electrode. The fourth layer is provided between the first layer and the first electrode. The semiconductor part includes an active region and a termination region. The active region includes the control electrode, the second layer, and the third layer. The termination region surrounds the active region. The fifth layer is provided in the first layer in the termination region.

17 Claims, 11 Drawing Sheets

(58) Field of Classification Search
CPC ........................ H01L 29/0623; H01L 29/0638; H01L 29/404
See application file for complete search history.

(56) References Cited

U.S. PATENT DOCUMENTS

| | | | |
|---|---|---|---|
| 11,081,410 B2 * | 8/2021 | Takishita | ............ H01L 29/8613 |
| 2016/0300938 A1 | 10/2016 | Tonari et al. | |
| 2020/0111869 A1 | 4/2020 | Fuji | |

FOREIGN PATENT DOCUMENTS

| | | |
|---|---|---|
| JP | 2015-126192 A | 7/2015 |
| JP | 2015-179774 A | 10/2015 |
| JP | 6028852 B2 | 11/2016 |
| JP | WO 2015/087507 A1 | 3/2017 |
| JP | 6224454 B2 | 11/2017 |
| JP | 2020-057746 A | 4/2020 |

* cited by examiner

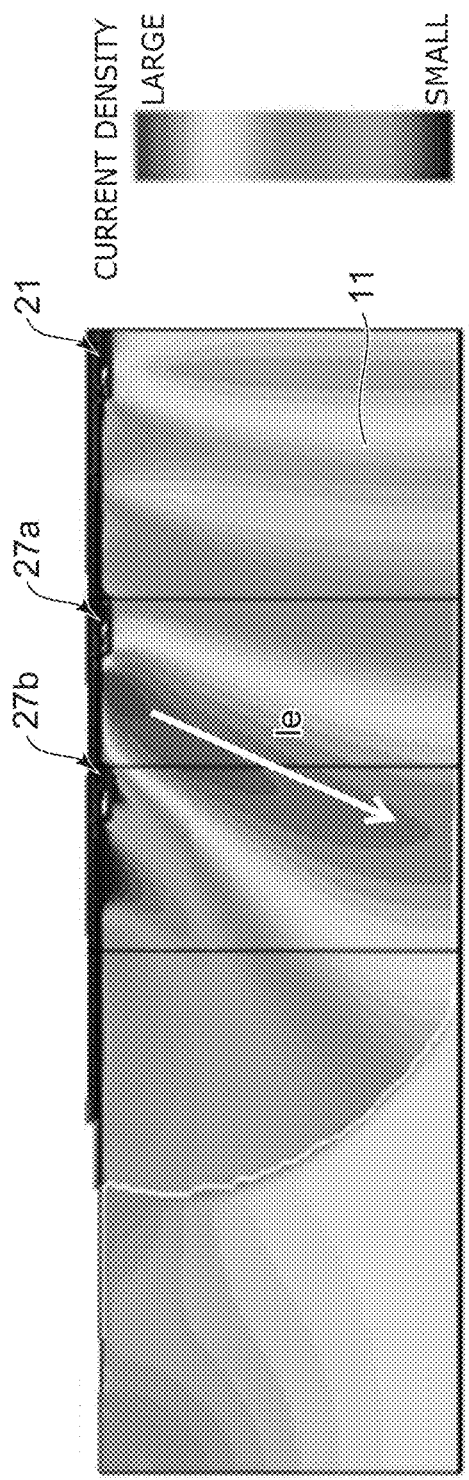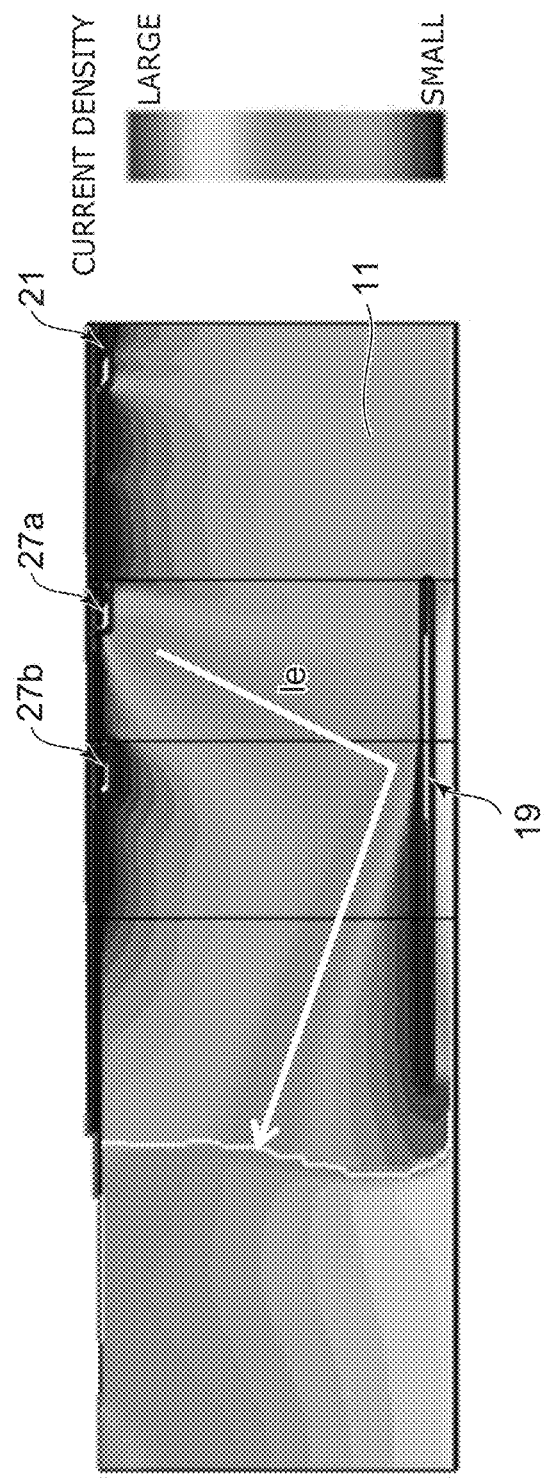
FIG. 8A
FIG. 8B

SEMICONDUCTOR DEVICE

CROSS-REFERENCE TO RELATED APPLICATIONS

This application is based upon and claims the benefit of priority from Japanese Patent Application No. 2021-150262, filed on Sep. 15, 2021; the entire contents of which are incorporated herein by reference.

FIELD

Embodiments related to a semiconductor device.

BACKGROUND

A semiconductor device used in a power converter or the like is required to have high reliability. For example, it is important for such a device to have high breakdown immunity at high voltages and high currents.

BRIEF DESCRIPTION OF THE DRAWINGS

FIGS. 8A and 8B are other schematic cross-sectional views showing the characteristic of the semiconductor device according to the embodiment;

DETAILED DESCRIPTION

Figure 1:
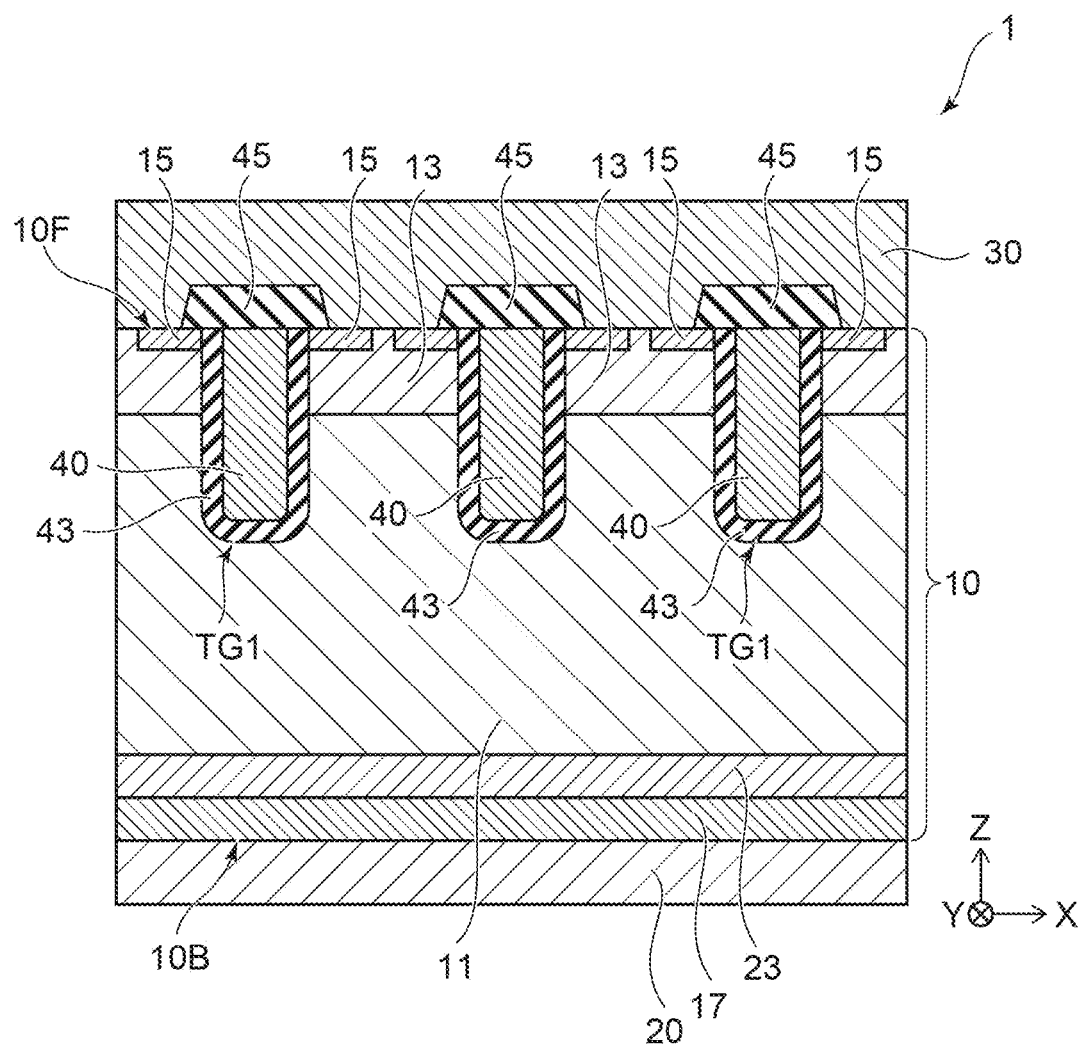
FIG. 1 is a schematic cross-sectional view showing a semiconductor device according to an embodiment.

According to one embodiment, a semiconductor device includes a semiconductor part, first and second electrodes and a control electrode. The semiconductor part includes a first semiconductor layer of a first conductivity type, a second semiconductor layer of a second conductivity type, a third semiconductor layer of the first conductivity type, a fourth semiconductor layer of the second conductivity type and a fifth semiconductor layer of the second conductivity type. The first electrode is provided on a back surface of the semiconductor part. The second electrode is provided on a front surface of the semiconductor part. The control electrode provided inside a trench in the semiconductor part. The control electrode is provided between the semiconductor part and the second electrode. The control electrode is electrically insulated from the semiconductor part by a first insulating film and electrically insulated from the second electrode by a second insulating film. The first semiconductor layer extends between the first electrode and the second electrode. The second semiconductor layer is provided between the first semiconductor layer and the second electrode. The third semiconductor layer is partially provided between the second semiconductor layer and the second electrode. The fourth semiconductor layer is provided between the first semiconductor layer and the first electrode. The control electrode extending in the first semiconductor layer from the front side of the semiconductor part. The second semiconductor layer faces the control electrode via the first insulating film. The semiconductor part includes an active region and a termination region. The active region includes the control electrode, the second semiconductor layer, and the third semiconductor layer. The termination region surrounds the active region. The fifth semiconductor layer is provided in the first semiconductor layer in the termination region and extends in a first direction directed along a boundary between the first semiconductor layer and the fourth semiconductor layer. The fifth semiconductor layer is provided with first and second distances in a second direction directed from the first electrode toward the second electrode. The first distance from the fifth semiconductor layer to the front surface of the semiconductor part is greater than the second distance from the fifth semiconductor layer to the back surface of the semiconductor part.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

The impurity concentrations of the semiconductor layers described in the embodiments can be measured by, for example, TOF-SIMS (Time of Flight-Secondary Ion Mass Spectrometry). The relative levels of the impurity concentrations can be determined from, for example, the levels of the carrier concentrations determined by SCM (Scanning Capacitance Microscopy). Distances such as the depths, thicknesses, and the like of the impurity regions can be determined by, for example, TOF-SIMS. Distances such as the depths, thicknesses, widths, spacing, and the like of the impurity regions can be determined from, for example, a synthesized image of a SCM image and an AFM image (Atomic Force Microscope image).

Figure 2:
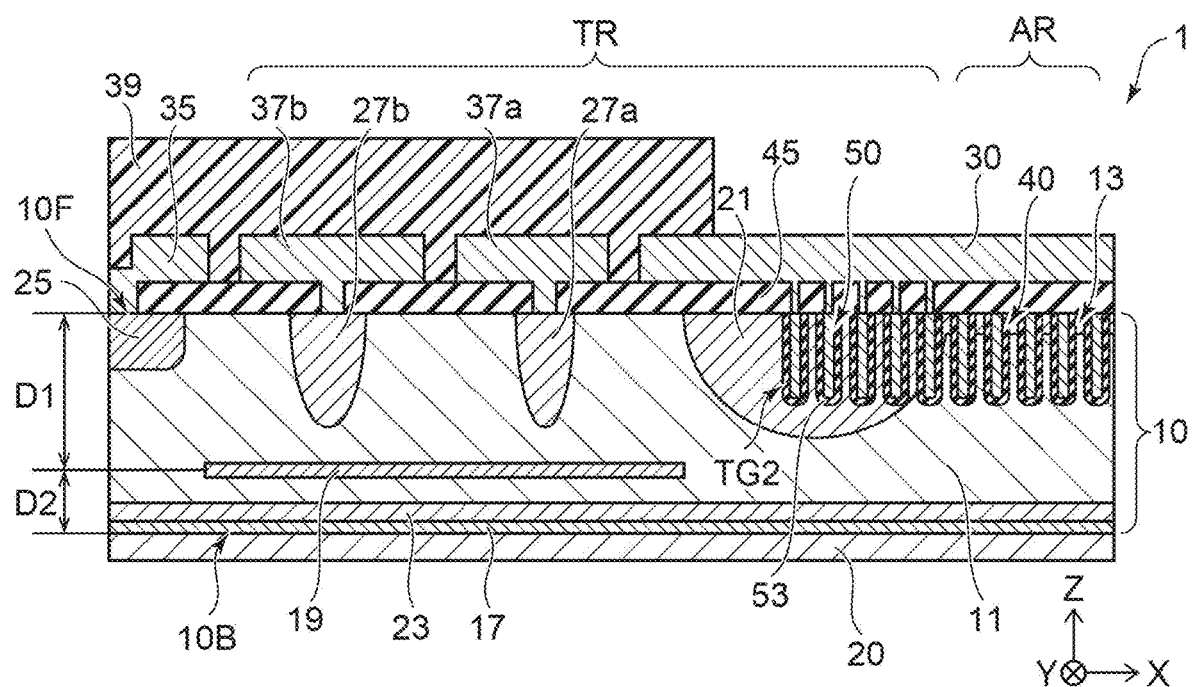
FIG. 2 is another schematic cross-sectional view showing the semiconductor device according to the embodiment.

FIGS. 1 and 2 are schematic cross-sectional views showing a semiconductor device 1 according to the embodiment. The semiconductor device 1 is an IGBT (Insulated Gate Bipolar Transistor). The semiconductor device 1 includes an active region AR and a termination region TR. FIG. 1 is a cross-sectional view showing the structure of the active region AR. FIG. 2 is a cross-sectional view showing the structure of the termination region TR.

As shown in FIG. 1, the semiconductor device 1 includes a semiconductor part 10, a first electrode 20, a second electrode 30, and a control electrode 40. The first electrode 20 is provided on a back surface 10B of the semiconductor part 10. The second electrode 30 is provided on a front surface 10F of the semiconductor part 10. The semiconductor part 10 is, for example, silicon. The first electrode 20 is, for example, a collector electrode. The second electrode 30 is, for example, an emitter electrode.

The control electrode 40 is provided inside a trench TG1. The trench TG1 is provided in the front side of the semiconductor part 10. The control electrode 40 is positioned between the semiconductor part 10 and the second electrode 30. The control electrode 40 is electrically insulated from the semiconductor part 10 by a first insulating film 43. Also, the control electrode 40 is electrically insulated from the second electrode 30 by a second insulating film 45. The first insulating film 43 is, for example, a gate insulating film. The second insulating film 45 is, for example, an inter-layer insulating film. The first insulating film 43 and the second insulating film 45 are, for example, silicon oxide films.

As shown in FIG. 1, the semiconductor part 10 includes, for example, a first semiconductor layer 11 of a first conductivity type, a second semiconductor layer 13 of a second conductivity type, a third semiconductor layer 15 of the first conductivity type, and a fourth semiconductor layer 17 of the second conductivity type. Hereinbelow, the first conductivity type is described as an n-type; and the second conductivity type is described as a p-type.

The first semiconductor layer 11 extends between the first electrode 20 and the second electrode 30. The first semiconductor layer 11 is, for example, an n-type base layer. The control electrode 40 extends in the first semiconductor layer 11 from the front side of the semiconductor part 10.

The second semiconductor layer 13 is provided between the first semiconductor layer 11 and the second electrode 30. The second semiconductor layer 13 is, for example, a p-type base layer. The second semiconductor layer 13 faces the control electrode 40 via the first insulating film 43.

The third semiconductor layer 15 is partially provided between the second semiconductor layer 13 and the second electrode 30. The third semiconductor layer 15 is, for example, an n-type emitter layer. The third semiconductor layer 15 contacts the first insulating film 43. The second electrode 30 is electrically connected to the second and third semiconductor layers 13 and 15.

The fourth semiconductor layer 17 is provided between the first semiconductor layer 11 and the first electrode 20. The fourth semiconductor layer 17 is, for example, a p-type collector layer. The first electrode 20 is electrically connected to the fourth semiconductor layer 17.

As shown in FIG. 2, the semiconductor part 10 further includes a fifth semiconductor layer 19 of the second conductivity type, a sixth semiconductor layer 21 of the second conductivity type, a seventh semiconductor layer 23 of the first conductivity type, an eighth semiconductor layer 25 of the first conductivity type, and ninth semiconductor layers 27*a* and 27*b* of the second conductivity type.

The sixth semiconductor layer 21 is provided at the front side of the semiconductor part 10 and is positioned at the boundary between the active region AR and the termination region TR. The sixth semiconductor layer 21 is provided between the first semiconductor layer 11 and the second electrode 30 in the direction from the first electrode 20 toward the second electrode 30, e.g., a Z-direction. The sixth semiconductor layer 21 is, for example, a p-type guard ring. The sixth semiconductor layer 21 is linked to the second semiconductor layer 13.

The fifth semiconductor layer 19 is provided in the first semiconductor layer 11 in the termination region TR. The fifth semiconductor layer 19 has a plate shape that extends in a direction that is along the back surface 10B of the semiconductor part 10, e.g., an X-direction. Here, "plate shape" refers to, for example, a shape that extends in the X-direction and the Y-direction and has a thickness in the Z-direction that is less than the lengths in the X-direction and the Y-direction.

For example, a first distance D1 from the fifth semiconductor layer 19 to the front surface 10F of the semiconductor part 10 in the Z-direction is greater than a second distance D2 from the fifth semiconductor layer 19 to the back surface 10B of the semiconductor part 10 in the Z-direction. The fifth semiconductor layer 19 is provided at a position that is apart from the fourth semiconductor layer 17 of the second conductivity type. The fifth semiconductor layer 19 is provided to have a floating potential in the first semiconductor layer 11 of the first conductivity type.

The seventh semiconductor layer 23 is provided between the first semiconductor layer 11 and the fourth semiconductor layer 17. The seventh semiconductor layer 23 is, for example, an n-type buffer layer. The seventh semiconductor layer 23 includes a first-conductivity-type impurity with a higher concentration than a concentration of a first-conductivity-type impurity in the first semiconductor layer 11. The seventh semiconductor layer 23 is electrically connected to the first semiconductor layer 11. The fifth semiconductor layer 19 is provided at a position that is apart from the seventh semiconductor layer 23.

Although the fourth semiconductor layer 17 extends from the active region AR to the termination region TR in the example described above, embodiments are not limited to such a fourth semiconductor layer 17. For example, a structure may be used in which the fourth semiconductor layer 17 does not extend into the termination region TR, and the seventh semiconductor layer 23 is connected to the first electrode 20 in the termination region TR.

The eighth semiconductor layer 25 is provided at, a position that is apart from the sixth semiconductor layer 21 at the front side of the semiconductor part 10. The eighth semiconductor layer 25 is a so-called EQPR (Equivalent Potential Ring) layer. The eighth semiconductor layer 25 includes a first-conductivity-type impurity with a higher concentration than the concentration of the first-conductivity-type impurity in the first semiconductor layer 11 and is electrically connected to the first semiconductor layer 11.

The ninth semiconductor layers 27*a* and 27*b* are provided between the sixth semiconductor layer 21 and the eighth semiconductor layer 25 at the front side of the semiconductor part 10. The ninth semiconductor layers 27*a* and 27*b* are, for example, p-type guard rings. The ninth semiconductor layers 27*a* and 27*b* are apart from each other and are provided at positions that are apart from the sixth and eighth semiconductor layers 21 and 25. The ninth semiconductor layer 27*a* is provided between the sixth semiconductor layer 21 and the ninth semiconductor layer 27*b*. The ninth semiconductor layers 27a and 27b are not limited to the example. For example, a configuration that includes three or more ninth semiconductor layers may be used.

The first semiconductor layer 11 includes portions positioned between the fifth semiconductor layer 19 and the ninth semiconductor layer 27a and between the fifth semiconductor layer 19 and the ninth semiconductor layer 27b. Also, the first semiconductor layer 11 includes other portions positioned between the ninth semiconductor layers 27a and 27b, between the sixth semiconductor layer 21 and the ninth semiconductor layer 27a, and between the eighth semiconductor layer 25 and the ninth semiconductor layer 27b.

The semiconductor device 1 further includes a third electrode 35, fourth electrodes 37a, 37b, and a fifth electrode 50. The third electrode 35 and the fourth electrodes 37a and 37b, for example, are provided on the semiconductor part 10 with the second insulating film 45 interposed in the termination region TR. The second insulating film 45 extends along the front surface 10F of the semiconductor part 10 from the active region AR to the termination region TR. Embodiments are not limited to the example; for example, the front surface of the termination region TR may be covered with an inter-layer insulating film other than the second insulating film 45. Another inter-layer insulating film may be provided on the second insulating film 45. Three or more fourth electrodes 37 may be included to match the number of the ninth semiconductor layers 27.

The third electrode 35 is provided on the eighth semiconductor layer 25. The third electrode 35 is, for example, an EQPR electrode. The third electrode 35 is electrically connected to the eighth semiconductor layer 25.

The fourth electrodes 37a and 37b are provided between the second electrode 30 and the third electrode 35. The fourth electrodes 37a and 37b are apart from each other and apart from the second and third electrodes 30 and 35. The fourth electrodes 37a and 37b are, for example, field plate electrodes.

The fourth electrode 37a is provided on the ninth semiconductor layer 27a. The fourth electrode 37b is provided on the ninth semiconductor layer 27b. For example, the fourth electrodes 37a and 37b are electrically connected respectively to the ninth semiconductor layers 27a and 27b via contact holes provided in the second insulating film 45.

The fifth electrode 50 is provided between the semiconductor part 10 and the second electrode 30. The fifth electrode 50 is provided inside a trench TG2 that is provided in the front side of the semiconductor part 10; and the fifth electrode 50 is electrically insulated from the semiconductor part 10 by a third insulating film 53. The third insulating film 53 is, for example, a silicon oxide film. The fifth electrode 50, for example, extends in the sixth semiconductor layer 21 and is electrically connected to the second electrode 30. The fifth electrode 50 may extend into the ninth semiconductor layers 27a and 27b.

Figure 3:
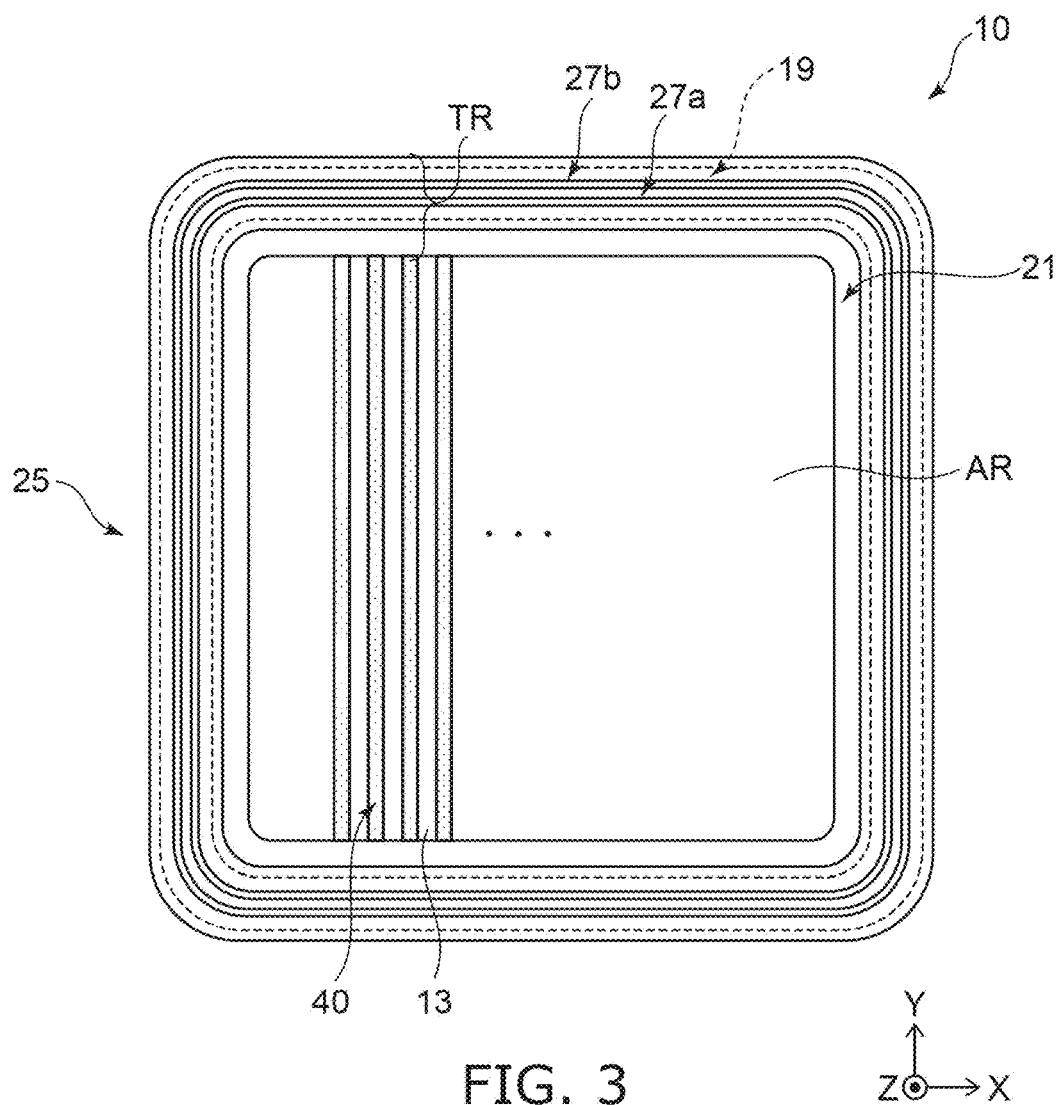
FIG. 3 is a schematic plan view showing the semiconductor device according to the embodiment.

FIG. 3 is a schematic plan view showing the semiconductor device 1 according to the embodiment. FIG. 3 is a plan view illustrating the front surface 10F of the semiconductor part 10.

As shown in FIG. 3, the termination region TR surrounds the active region AR. The active region AR includes the second semiconductor layer 13, the third semiconductor layer 15, and the control electrode 40. The termination region TR includes the fifth semiconductor layer 19, the sixth semiconductor layer 21, the eighth semiconductor layer 25, and the ninth semiconductor layers 27a and 27b (referring to FIG. 2). As shown in FIG. 3, the fifth semiconductor layer 19, the sixth semiconductor layer 21, the eighth semiconductor layer 25, and the ninth semiconductor layers 27a and 27b extend along the periphery of the active region in the X-direction or the Y-direction.

The sixth semiconductor layer 21 surrounds the active region AR along the boundary between the active region AR and the termination region TR. The ninth semiconductor layers 27a and 27b each surround the sixth semiconductor layer 21 and surround the active region AR at the outer side of the sixth semiconductor layer 21.

The fifth semiconductor layer 19 surrounds the active region AR between the sixth semiconductor layer 21 and the eighth semiconductor layer 25. The fifth semiconductor layer 19 is apart from the sixth and eighth semiconductor layers 21 and 25 in a plan view parallel to the front surface 10F of the semiconductor part 10. The fifth semiconductor layer 19, for example, is apart from the eighth semiconductor layer 25 by 5 micrometers (μm) in the plan view of the semiconductor part 10.

FIG. 3 is an example; the fifth semiconductor layer 19 is not limited to the configuration described above. For example, it is unnecessary for the fifth semiconductor layer 19 to have one ring-shaped pattern that surrounds the active region AR; and the fifth semiconductor layer 19 may be subdivided into multiple portions. Also, it is unnecessary for the fifth semiconductor layer 19 to have the uniform width; the fifth semiconductor layer 19 may be wider outside the corners of the active region AR than the width outside the other portions.

Figure 4:
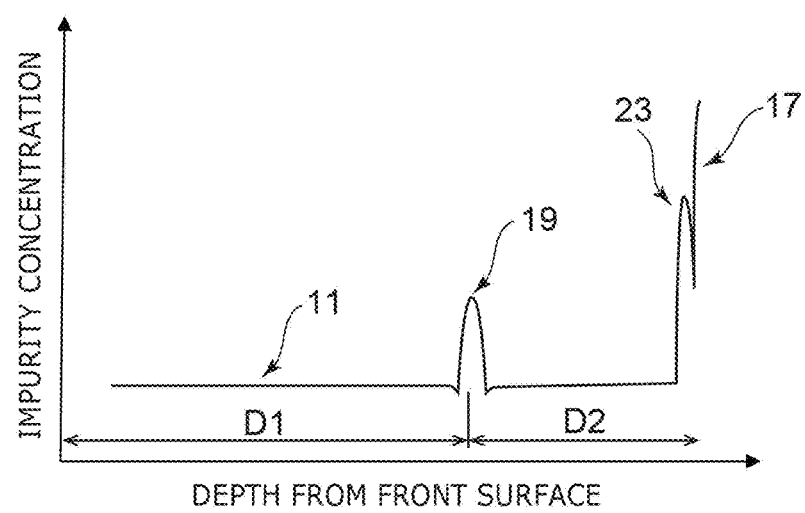
FIG. 4 is a schematic view showing the structure of the semiconductor device according to the embodiment.

FIG. 4 is a schematic view showing the structure of the semiconductor device according to the embodiment. FIG. 4 illustrates an example of the impurity concentration profile of the semiconductor part 10 in the Z-direction. That is, FIG. 4 illustrates the concentration distribution of the first-conductivity-type impurity in the first and seventh semiconductor layers 11 and 23. FIG. 4 also illustrates the concentration distribution of the second-conductivity-type impurity in the fourth and fifth semiconductor layers 17 and 19.

As shown in FIG. 4, the peak concentration of the second-conductivity-type impurity in the fifth semiconductor layer 19 is greater than the concentration of the first-conductivity-type impurity in the first semiconductor layer 11. The peak concentration of the second-conductivity-type impurity in the fifth semiconductor layer 19 is less than the concentration of the second-conductivity-type impurity in the fourth semiconductor layer 17.

For example, the concentration of the first-conductivity-type impurity in the first semiconductor layer 11 is in the concentration range of $1 \times 10^{12}$ to $1 \times 10^{14}$ cm$^{-3}$. The concentration of the second-conductivity-type impurity in the fourth semiconductor layer 17 is, for example, $1 \times 10^{19}$ cm$^{-3}$. The concentration of the second-conductivity-type impurity in the fifth semiconductor layer 19 is, for example, $1 \times 10^{16}$ cm$^{-3}$. The concentration of the first-conductivity-type impurity in the seventh semiconductor layer 23 is, for example, $1 \times 10^{17}$ to $1 \times 10^{18}$ cm$^{-3}$.

The peak concentration of the second-conductivity-type impurity in the fifth semiconductor layer 19 is less than the concentrations of the second-conductivity-type impurity in the ninth semiconductor layers 27a and 27b (not illustrated). The concentrations of the second-conductivity-type impurity in the ninth semiconductor layers 27a and 27b are, for example, $1 \times 10^{19}$ cm$^{-3}$. The peak concentration of the second-conductivity-type impurity in the fifth semiconductor layer 19 is less than the concentration of the second-conductivity-type impurity in the fourth semiconductor layer 17 and the concentrations of the second-conductivitytype impurity in the ninth semiconductor layers 27a and 27b, and thereby, the fifth semiconductor layer 19 is depleted without depleting the fourth semiconductor layer 17 and the ninth semiconductor layers 27a and 27b when the semiconductor device 1 turns from the on-state to the off-state.

The first distance D1 in the Z-direction from the fifth semiconductor layer 19 to the front surface 10F of the semiconductor part 10 is the distance from the peak position of the second-conductivity-type impurity concentration in the fifth semiconductor layer 19 to the front surface 10F of the semiconductor part 10. The second distance D2 in the Z-direction from the fifth semiconductor layer 19 to the back surface 10B of the semiconductor part 10 is the distance from the peak position of the second-conductivity-type impurity concentration in the fifth semiconductor layer 19 to the back surface 10B of the semiconductor part 10.

The thickness in the Z-direction of the semiconductor part 10, i.e., the distance from the back surface 10B of the semiconductor part 10 to the front surface 10F is, for example, not less than 50 µm and not more than 500 µm. The thickness in the Z-direction of the fourth semiconductor layer 17 is, for example, 0.2 µm. The thickness in the Z-direction of the seventh semiconductor layer 23 is, for example, 1 µm. The distance in the Z-direction between the fifth semiconductor layer 19 and the seventh semiconductor layer 23 is, for example, 7 µm. The thickness in the Z-direction of the fifth semiconductor layer 19 is, for example, 4 µm. In other words, the second distance D2 is, for example, 10 µm.

A method for manufacturing the semiconductor device 1 will now be described with reference to FIGS. 5A to 5D. FIGS. 5A to 5D are schematic cross-sectional views showing manufacturing processes of the semiconductor device 1 according to the embodiment.

Figure 5A:
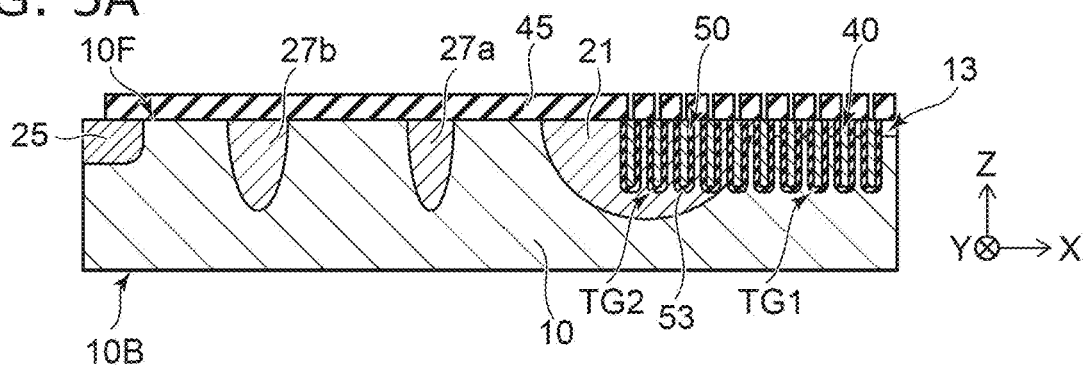
FIGS. 5A to 5D are schematic cross-sectional views showing manufacturing processes of the semiconductor device according to the embodiment.

As shown in FIG. 5A, formed at the front side of the semiconductor part 10 are the second semiconductor layer 13, the sixth semiconductor layer 21, the eighth semiconductor layer 25, the ninth semiconductor layer 27a, the ninth semiconductor layer 27b, the control electrode 40, and the fifth electrode 50. The semiconductor part 10 is, for example, an n-type silicon wafer.

After forming the trenches TG1 and TG2 in the front side of the semiconductor part 10, the first insulating film 43 (referring to FIG. 1) and the third insulating film 53 are formed to cover the inner surfaces of the trenches TG1 and TG2. The first insulating film 43 and the third insulating film 53 are, for example, silicon oxide films formed by thermal oxidation of the semiconductor part 10. Subsequently, the control electrode 40 and the fifth electrode 50 are formed inside the trenches TG1 and TG2. The control electrode 40 and the fifth electrode 50 are, for example, conductive polysilicon.

The second semiconductor layer 13, the sixth semiconductor layer 21, and the ninth semiconductor layers 27a and 27b are formed at the front side of the semiconductor part 10. The second, sixth and ninth semiconductor layers 13, 21, and 27a and 27b are formed by ion-implanting a second-conductivity-type impurity, e.g., boron (B) into the semiconductor part 10. The second, sixth and ninth semiconductor layers 13, 21, 27a and 27b are formed by activating and diffusing the ion-implanted second-conductivity-type impurity by heat treatment.

Subsequently, the third semiconductor layer 15 (referring to FIG. 1) and the eighth semiconductor layer 25 are formed at the front side of the semiconductor part 10 by ion-implanting a first-conductivity-type impurity, e.g., phosphorus (P). The third semiconductor layer 15 and the eighth semiconductor layer 25 are formed by activating the ion-implanted first-conductivity-type impurity by heat treatment.

The second insulating film 45 is formed on the front surface 10F of the semiconductor part 10. The second insulating film 45 is, for example, a silicon oxide film formed using CVD (Chemical Vapor Deposition). Contact holes are formed in the second insulating film 45. The contact holes are formed to communicate respectively with the fifth electrode 50 and the ninth semiconductor layers 27a and 27b. Subsequently, the semiconductor part 10 is thinned to the prescribed thickness by, for example, etching or polishing.

Figure 5B:
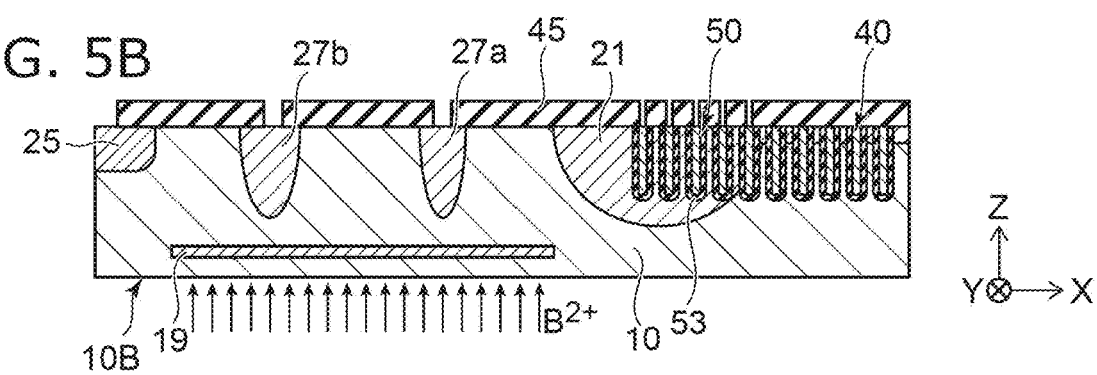

As shown in FIG. 5B, the second-conductivity-type impurity, e.g., boron (B) is partially ion-implanted into the backside of the semiconductor part 10. The first-conductivity-type impurity is ion-implanted to the prescribed depth in the termination region TR. For example, boron ions $B^{2+}$ are ion-implanted with an acceleration energy of 5 MeV.

Figure 5C:
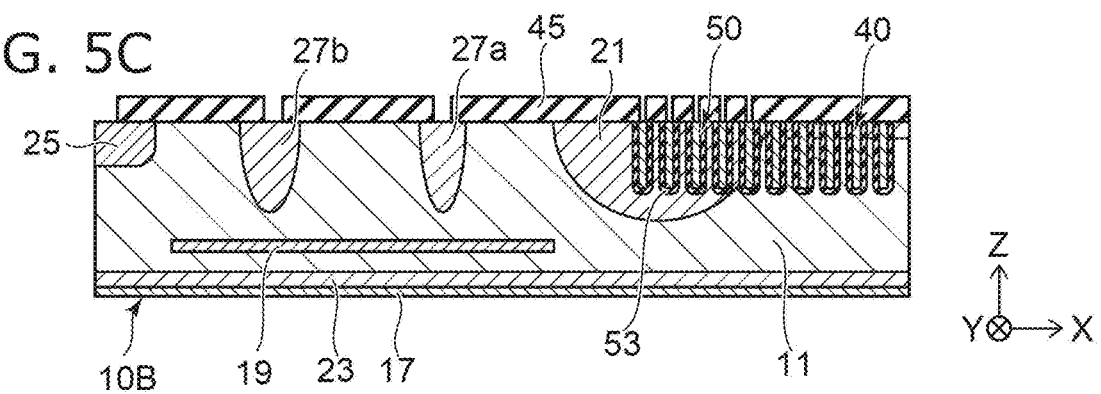

The second-conductivity-type impurity, e.g., boron (B) and the first-conductivity-type impurity, e.g., phosphorus (P) that are used to form the fourth semiconductor layer 17 and the seventh semiconductor layer 23 are ion-implanted into the backside of the semiconductor part 10. Subsequently, as shown in FIG. 5C, the fourth, fifth and seventh semiconductor layers 17, 19 and 23 are formed by activating the ion-implanted impurities by, for example, heat treatment at not more than 1000° C.

Figure 5D:
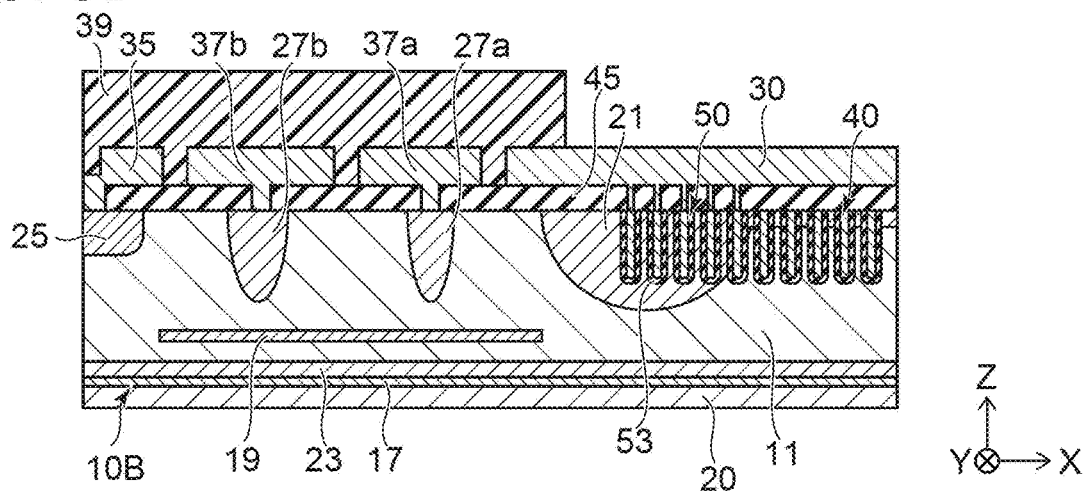

As shown in FIG. 5D, the first electrode 20 is formed on the back surface of the semiconductor part 10. The first electrode 20 is, for example, a metal layer that includes titanium (Ti) and aluminum (Al). The second electrode 30, the third electrode 35, and the fourth electrodes 37a and 37b are formed at the front side of the semiconductor part 10. The second, third and fourth electrodes 30, 35, 37a and 37b are, for example, metal layers that include titanium nitride (TiN), tungsten (W), and aluminum (Al). A resin layer 39 is formed at the front side of the termination region TR of the semiconductor part 10. The resin layer 39 covers the fourth electrodes 37a and 37b. The resin layer 39 is, for example, a polyimide resin.

The semiconductor device 1 is operated by applying a prescribed voltage (a collector voltage) between the first electrode 20 and the second electrode 30 and by applying a control voltage (a gate voltage) between the second electrode 30 and the control electrode 40.

For example, when the control voltage is greater than the threshold of the control electrode 40, an inversion layer of the first conductivity type is induced at the interface between the first insulating film 43 and the second semiconductor layer 13. Thereby, first-conductivity-type carriers (electrons) are injected from the second electrode 30 into the first semiconductor layer 11 via the third semiconductor layer 15 and the inversion layer. Accordingly, second-conductivity-type carriers (holes) are injected from the fourth semiconductor layer 17 into the first semiconductor layer 11 via the seventh semiconductor layer 23.

The first-conductivity-type carriers are ejected from the first semiconductor layer 11 into the first electrode 20 via the seventh and fourth semiconductor layers 23 and 17. The second-conductivity-type carriers are ejected from the first semiconductor layer 11 into the second electrode 30 via the second semiconductor layer 13. Thereby, in the on-state, the collector current flows between the first electrode 20 and the second electrode 30.

When the control voltage is reduced below the threshold of the control electrode 40, the inversion layer disappears, which is induced between the second semiconductor layer 13 and the first insulating film 43. Therefore, the injection of the first-conductivity-type carriers from the second electrode 30 into the first semiconductor layer 11 stops; and the injection of the second-conductivity-type carriers from the first electrode 20 into the first semiconductor layer 11 also stops. Subsequently, the ejections of first-conductivity-type carriers from the first semiconductor layer 11 into the first electrode 20 and the second-conductivity-type carriers from the first semiconductor layer 11 into the second electrode 30 are continued. Thus, the first semiconductor layer 11 is depleted. Thereby, the semiconductor device 1 is turned to the off-state. The characteristics of the semiconductor device 1 after transitioned from the on-state to the off-state (turned off) will now be described.

Figure 6A:
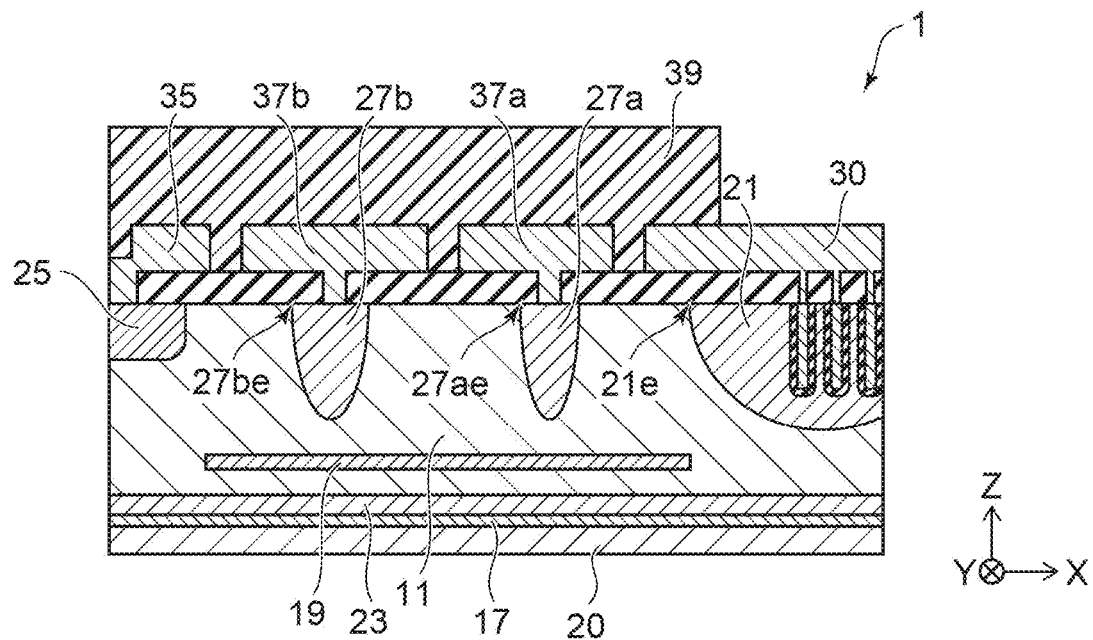
FIGS. 6A and 6B are schematic views showing a characteristic of the semiconductor device according to the embodiment.
Figure 6B:
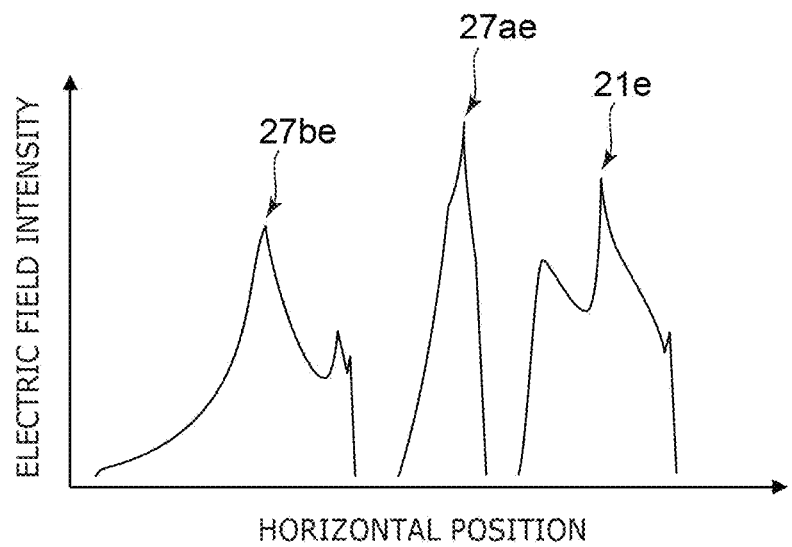

FIGS. 6A and 6B are schematic views showing a characteristic of the semiconductor device 1 according to the embodiment. FIG. 6B illustrates an electric field distribution at the vicinity of the front surface 10F side of the termination region TR when turning off the semiconductor device 1.

As shown in FIG. 6B, for example, the electric field distribution in the termination region TR has peaks at an outer edge 21e of the sixth semiconductor layer 21, an outer edge 27ae of the ninth semiconductor layer 27a, and an outer edge 27be of the ninth semiconductor layer 27b.

Thus, by providing the ninth semiconductor layers 27a and 27b to surround the active region AR, the electric field of the termination region TR can be extended in the lateral direction. Electric field concentration at the outer edge 21e of the sixth semiconductor layer 21 that is linked to the active region AR can be relaxed thereby, and the breakdown voltage of the termination region TR can be increased.

By providing the fifth semiconductor layer 19 in the first semiconductor layer 11, the electric field intensity of the outer edge 27ae of the ninth semiconductor layer 27a becomes greater than the electric field intensity of the outer edge 21e of the sixth semiconductor layer 21 and the electric field intensity of the outer edge 27be of the ninth semiconductor layer 27b.

Figure 7A:
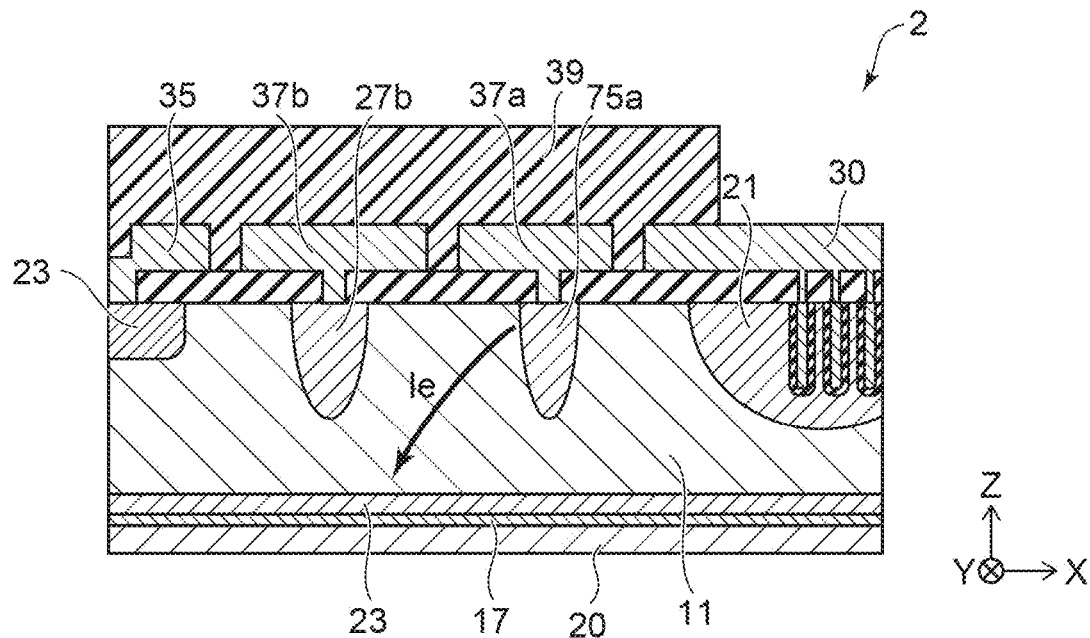
FIGS. 7A and 7B are schematic cross-sectional views showing a characteristic of the semiconductor device according to the embodiment.
Figure 7B:
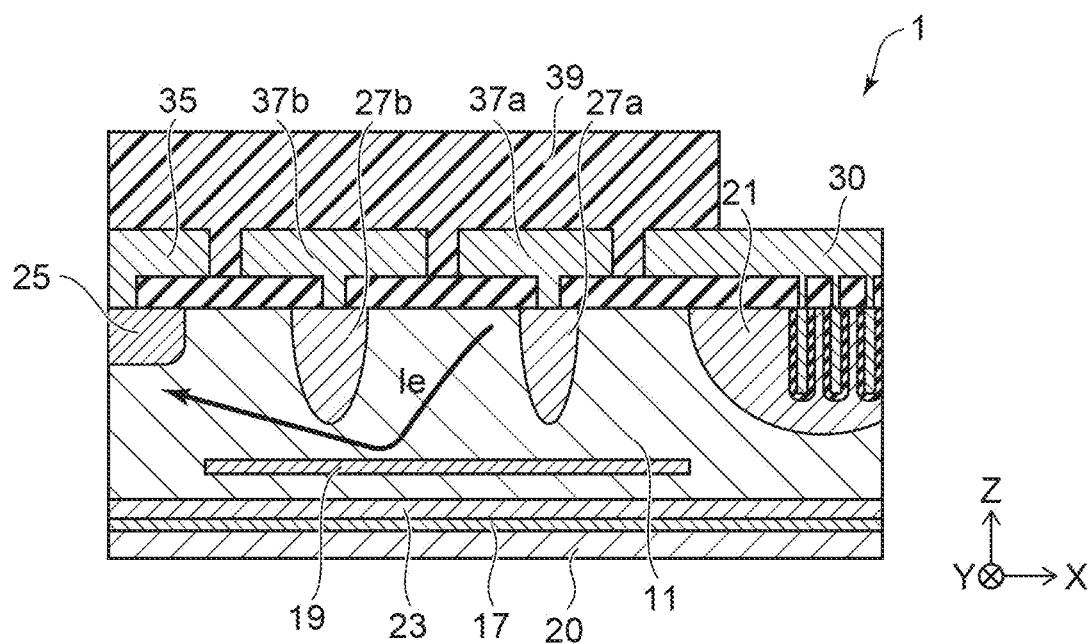

FIGS. 7A and 7B are schematic cross-sectional views showing a characteristic of the semiconductor device 1 according to the embodiment. FIG. 7A illustrates the path of an electron current Ie when avalanche breakdown occurs in a semiconductor device 2 according to a comparative example. In the semiconductor device 2, the fifth semiconductor layer 19 is not included in the termination region TR. FIG. 7B illustrates the path of the electron current Ie when avalanche breakdown occurs in the semiconductor device 1.

When turning off the semiconductor devices 1 and 2, for example, avalanche breakdown occurs in the termination region TR as a voltage Vce applied between the first electrode 20 and the second electrode 30 is increased. The avalanche breakdown occurs at the portion of the termination region TR where the electric field intensity is high. As shown in FIG. 6B, the electric field intensity of the outer edge 27ae of the ninth semiconductor layer 27a is greater than those of the other portions. Therefore, the avalanche breakdown occurs at the outer edge 27ae of the ninth semiconductor layer 27a. In other words, the outer edge 27ae of the ninth semiconductor layer 27a becomes the breakdown point.

As shown in FIG. 7A, in the semiconductor device 2, the electron current Ie due to the avalanche breakdown flows from the outer edge 27ae (see FIG. 6A) of the ninth semiconductor layer 27a through the seventh and fourth semiconductor layers 23 and 17 to the first electrode 20.

In the semiconductor device 1 shown in FIG. 7B, the electron current Ie avoids the fifth semiconductor layer 19 and flows in the direction of the eighth semiconductor layer 25. Therefore, the flow path of the electron current Ie becomes long, and the electrical resistance increases.

FIGS. 8A and 8B are other schematic cross-sectional views showing the characteristic of the semiconductor device 1 according to the embodiment. FIG. 8A illustrates the path of the electron current Ie when the avalanche breakdown occurs in the semiconductor device 2 according to the comparative example. FIG. 8B illustrates the path of the electron current Ie when the avalanche breakdown occurs in the semiconductor device 1.

FIGS. 8A and 8B illustrate the current density in the first semiconductor layer 11. The shading of the colors in the drawings shows the magnitude relationship of the current density. As shown by the arrows in the drawings, the electron currents Ie flow along regions where the current density is high.

Figure 9:
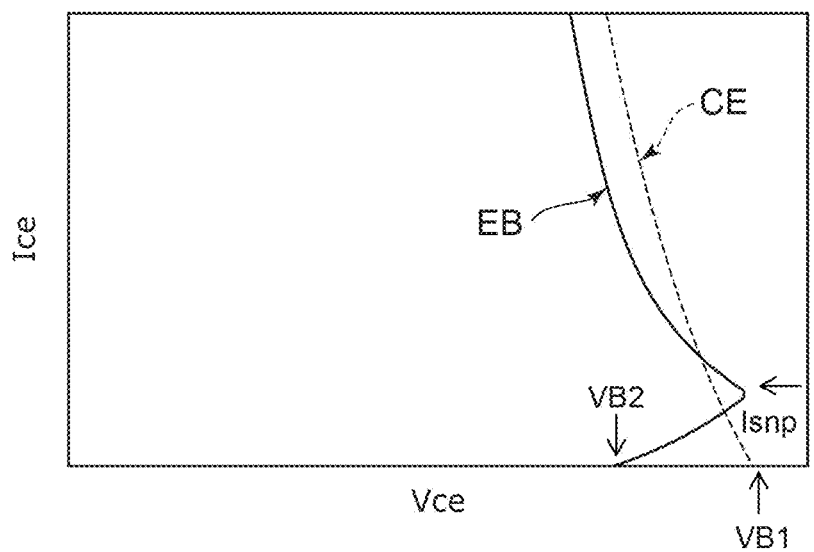
FIG. 9 is a schematic cross-sectional view showing characteristics of the semiconductor devices according to the embodiment.

FIG. 9 is a schematic view showing the characteristics of the semiconductor devices 1 and 2 according to the embodiment. FIG. 9 is a graph illustrating the voltage-current characteristic in the turn-off process. The horizontal axis is the voltage Vce applied between the first electrode 20 and the second electrode 30. The vertical axis is a current Ice flowing between the first electrode 20 and the second electrode 30. In FIG. 9, "EB" illustrates the characteristic of the semiconductor device 1, and "CE" illustrates the characteristic of the semiconductor device 2.

As shown in FIG. 9, in the semiconductor device 2, the voltage Vce is increased, and the avalanche breakdown occurs when Vce reaches a breakdown voltage VB1. Then, the current Ice flows, and the density of the space charge (the electrons and the holes) in the first semiconductor layer 11 increases. Therefore, the resistance of the current path in the first semiconductor layer 11 decreases, and so-called snapback occurs in which the voltage Vce decreases. When snapback occurs, the increase of the current Ice is accelerated, and there are cases where element breakdown occurs due to overcurrent.

In the semiconductor device 1, the avalanche breakdown occurs when the voltage Vce reaches a breakdown voltage VB2. Furthermore, the current Ice gradually increases with the increase of the voltage Vce. When the current Ice reaches Isnap, the decrease of the voltage Vce starts, and snapback occurs.

In the semiconductor device 1, the flow path of the electron current Ie is longer, and the electrical resistance of the flow path is higher. Therefore, the voltage Vce does not decrease directly after the avalanche breakdown starts; and snapback occurs after the current Ice has reached the level of Isnap. In other words, the electrical resistance of the flow path of the electron current Ie acts as a so-called ballast resistance; and the accelerating increase of the current Ice can be suppressed. Thus, in the semiconductor device 1, the breakdown voltage VB is reduced compared to the semiconductor device 2, but snapback can be suppressed. In other words, in the semiconductor device 1, the breakover immunity can be improved.

Figure 10:
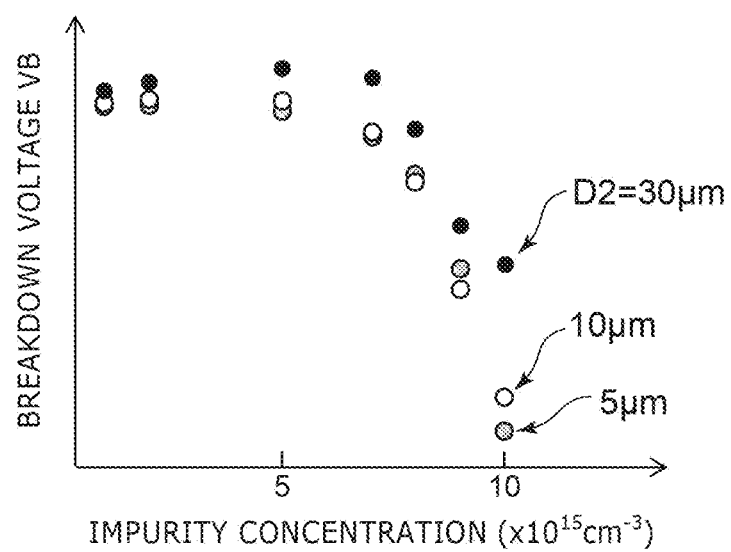
FIG. 10 is a graph showing another characteristic of the semiconductor device according to the embodiment.

FIG. 10 is a graph showing another characteristic of the semiconductor device 1 according to the embodiment. FIG. 10 is a graph illustrating the relationship between the breakdown voltage VB and the concentration of the second-conductivity-type impurity of the fifth semiconductor layer 19. The horizontal axis is the impurity concentration of the fifth semiconductor layer 19. The vertical axis is the breakdown voltage VB.

The second distance D2 from the back surface 10B of the semiconductor part 10 to the fifth semiconductor layer 19 is used as the parameter of the three graphs of FIG. 10. When the second distance D2 is, for example, 5 μm and 10 μm, the breakdown voltage VB is substantially constant in the region in which the impurity concentration of the fifth semiconductor layer 19 is not more than $5\times10^{15}$ cm$^{-3}$. The breakdown voltage VB decreases when the impurity concentration of the fifth semiconductor layer 19 exceeds $5\times10^{15}$ cm$^{-3}$. In other words, when the impurity concentration of the fifth semiconductor layer 19 exceeds $5\times10^{15}$ cm$^{-3}$, the electron current Ie flows so as to avoid the fifth semiconductor layer 19, which makes the improvement of the breakover immunity possible.

On the other hand, when D2 is 30 μm, the breakdown voltage VB increases with the increase of the impurity concentration of the fifth semiconductor layer 19; and the breakdown voltage VB decreases when the impurity concentration of the fifth semiconductor layer 19 exceeds $7\times10^{15}$ cm$^{-3}$.

Figure 11A:
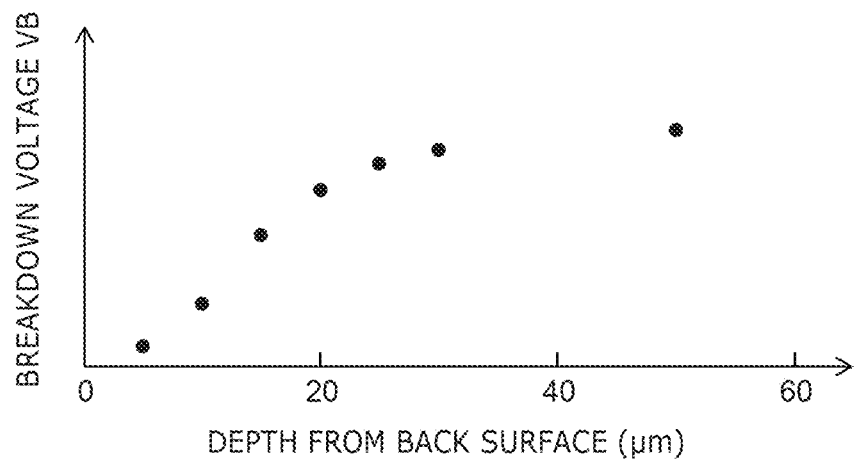
FIGS. 11A and 11B are graphs showing other characteristics of the semiconductor device according to the embodiment.
Figure 11B:
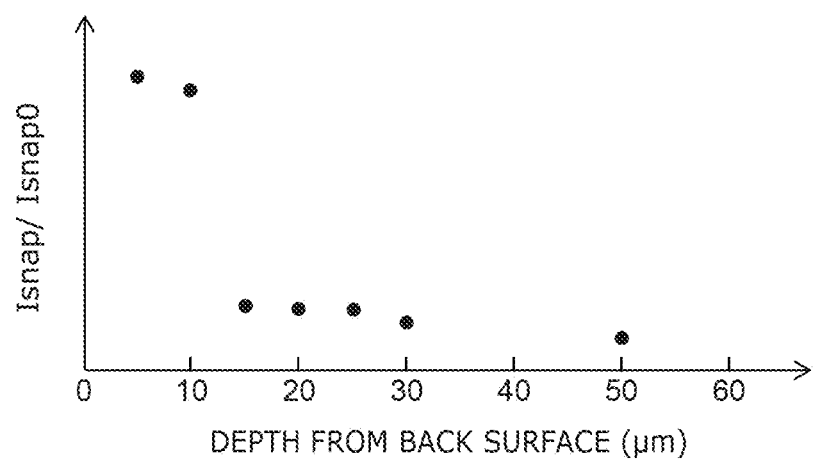

FIGS. 11A and 11B are graphs showing other characteristics of the semiconductor device 1 according to the embodiment. FIG. 11A is a graph showing the relationship between the breakdown voltage VB and the second distance D2 from the back surface 10B of the semiconductor part 10 to the fifth semiconductor layer 19. The vertical axis of FIG. 11A is the breakdown voltage VB. FIG. 11B is a graph showing the relationship between the second distance D2 and Isnap. The vertical axis of FIG. 11B is the ratio of Isnap to Isnap0. Isnap0 is a current Ice at which snapback starts when the fifth semiconductor layer 19 is not included.

As shown in FIG. 11A, the breakdown voltage VB increases as the second distance D2 increases. On the other hand, as shown in FIG. 11B, Isnap abruptly decreases when the second distance D2 exceeds 10 μm. When Isnap becomes small, snapback easily occurs, and the breakover immunity decreases (referring to FIG. 9). In other words, when the second distance D2 exceeds 10 μm, the effect of improving the breakover immunity is lost. Accordingly, the second distance D2 is preferably not more than 10 μm. Also, the second distance D2 is provided to obtain the desired breakdown voltage VB.

Figure 12:
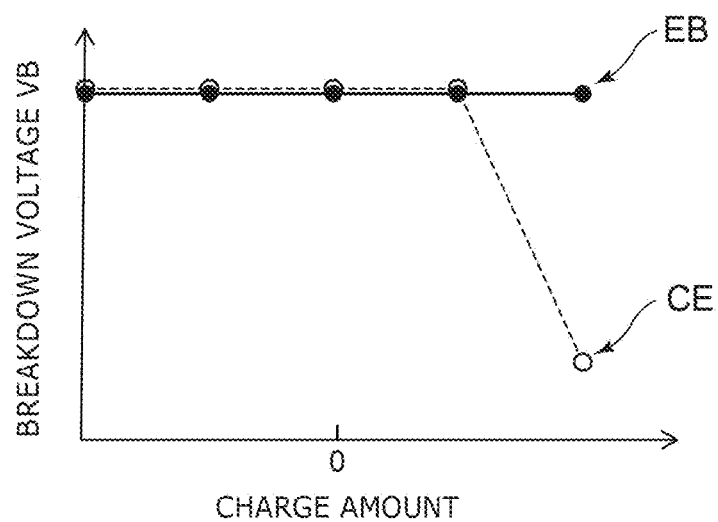
FIG. 12 is a graph showing another characteristic of the semiconductor device according to the embodiment.

FIG. 12 is a graph showing another characteristic of the semiconductor device 1 according to the embodiment. FIG. 12 is a graph illustrating the relationship between the breakdown voltage VB and the external charge stored in the termination region TR. The horizontal axis is the charge amount, and the vertical axis is the breakdown voltage VB.

For example, metal ions that penetrate from the outside are easily stored in the resin layer 39 that covers the termination region TR (referring to FIG. 2). The external charge due to such metal ions affects the electric field distribution in the termination region TR. For example, when a positive charge is stored between the third electrode 35 and the fourth electrode 37b, the lateral-direction extension of the electric field is suppressed in the termination region TR. Thus, there may be a case where the electric field intensity at the outer edge 27be of the ninth semiconductor layer 27b (referring to FIG. 6B) increases, and the breakdown voltage VB decreases.

In FIG. 12, "EB" denotes the characteristic of the semiconductor device 1. "CE" denotes the characteristic of the semiconductor device 2 according to the comparative example (referring to FIG. 7A).

As shown in FIG. 12, in the semiconductor device 2, the breakdown voltage VB decreases when the amount of the positive charge is high. In the semiconductor device 1, the breakdown voltage VB does not decrease even when the amount of the positive charge is high. In other words, in the semiconductor device 1, by providing the fifth semiconductor layer 19, the electric field can be suppressed at the outer edge 27be of the ninth semiconductor layer 27b. Thus, in the semiconductor device 1, the charge robustness can be improved, and the reduction of the breakdown voltage can be prevented in the termination region TR.

Figure 13A:
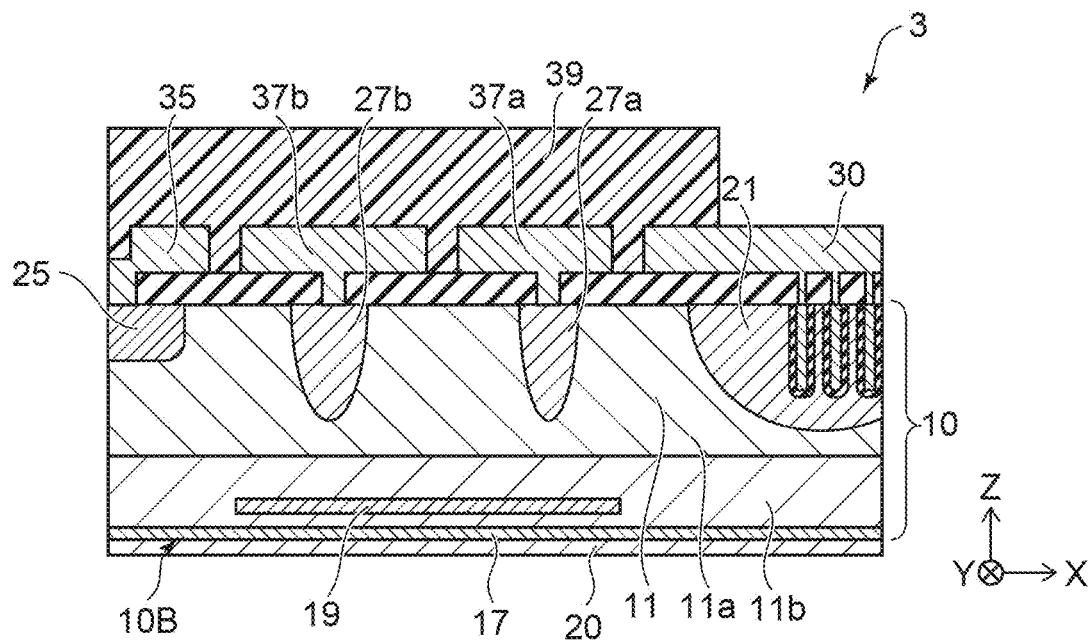
FIGS. 13A and 13B are schematic views showing a semiconductor device according to a modification of the embodiment.
Figure 13B:
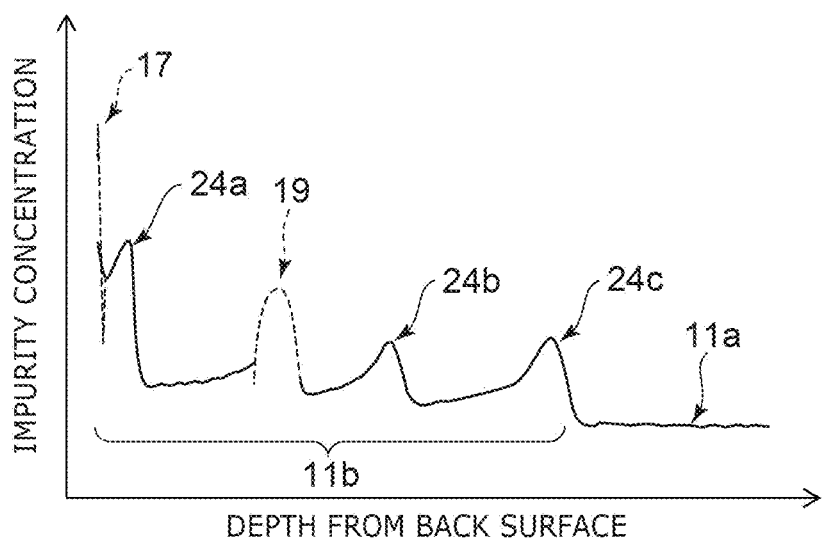

FIGS. 13A and 13B are schematic views showing a semiconductor device 3 according to a modification of the embodiment. FIG. 13A is a cross-sectional view showing the structure of the termination region TR of the semiconductor device 3. FIG. 13B illustrates the impurity concentration profile of the semiconductor part 10. The horizontal axis is the depth from the back surface 10B of the semiconductor part 10. The vertical axis is the impurity concentration.

As shown in FIG. 13A, the first semiconductor layer 11 includes a first region 11a and a second region 11b. The first region 11a is, for example, an n-type base region. The second region 11b is, for example, an n-type buffer region. The second region 11b is provided between the first region 11a and the fourth semiconductor layer 17. The fifth semiconductor layer 19 is provided in the second region 11b. The second region 11b is formed by, for example, proton irradiation at the backside of the semiconductor part 10 (referring to FIG. 5B).

As shown in FIG. 13B, the second region 11b includes a first-conductivity-type impurity with a higher concentration than the first region 11a. The second region 11b is formed to a depth of, for example, 20 μm from the back surface 10B of the semiconductor part 10. The concentration distribution in the depth direction of the second-conductivity-type impurity in the second region 11b includes, for example, multiple concentration peaks 24a to 24c. The fifth semiconductor layer 19 is provided between concentration peaks 24a and 24b of the second-conductivity-type impurity in the second region 11b.

The multiple concentration peaks 24a to 24c of the second region 11b include the first peak 24a that is positioned between the fourth semiconductor layer 17 and the fifth semiconductor layer 19, and the second peak 24b that is positioned between the first region 11a and the fifth semiconductor layer 19. The concentration of the first-conductivity-type impurity at the first peak 24a is greater than the concentration of the second-conductivity-type impurity in the fifth semiconductor layer 19. The concentration of the first-conductivity-type impurity at the second peak 24b is less than the concentration of the second-conductivity-type impurity of the fifth semiconductor layer 19.

The second region 11b may be formed so that the distribution of the first-conductivity-type impurity includes one concentration peak. In such a case, the fifth semiconductor layer 19 is provided between the fourth semiconductor layer 17 and the concentration peak of the first-conductivity-type impurity.

Also, in the example, by providing the fifth semiconductor layer 19 in the termination region TR, the breakover immunity can be improved, and the charge robustness can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part including a first semiconductor layer of a first conductivity type, a second semiconductor layer of a second conductivity type, a third semiconductor layer of the first conductivity type, a fourth semiconductor layer of the second conductivity type and a fifth semiconductor layer of the second conductivity type;
a first electrode provided on a back surface of the semiconductor part;
a second electrode provided on a front surface of the semiconductor part, the first semiconductor layer extending between the first electrode and the second electrode, the second semiconductor layer being provided between the first semiconductor layer and the second electrode, the third semiconductor layer being partially provided between the second semiconductor layer and the second electrode, the fourth semiconductor layer being provided between the first semiconductor layer and the first electrode; and
a control electrode provided inside a trench in the semiconductor part, the control electrode being provided between the semiconductor part and the second electrode, the control electrode being electrically insulated from the semiconductor part by a first insulating film and electrically insulated from the second electrode by a second insulating film, the control electrode extending in the first semiconductor layer from the front side of the semiconductor part, the second semiconductor layer facing the control electrode via the first insulating film,
the semiconductor part including an active region and a termination region, the active region including the control electrode, the second semiconductor layer, and the third semiconductor layer, the termination region surrounding the active region,
the fifth semiconductor layer being provided in the first semiconductor layer in the termination region and extending in a first direction directed along a boundary between the first semiconductor layer and the fourth semiconductor layer,
the fifth semiconductor layer being provided with first and second distances in a second direction directed from the first electrode toward the second electrode, the first distance from the fifth semiconductor layer to the front surface of the semiconductor part being greater than the second distance from the fifth semiconductor layer to the back surface of the semiconductor part.

2. The device according to claim 1, wherein
the second distance is not more than 10 micrometers.

3. The device according to claim 1, wherein
the fifth semiconductor layer includes a second-conductivity-type impurity with a concentration of not less than $5 \times 10^{15}$ cm$^{-3}$.

4. The device according to claim 1, wherein
the semiconductor part further includes a sixth semiconductor layer of the second conductivity type, the sixth semiconductor layer being provided at the front side of the semiconductor part, the sixth semiconductor layer surrounding the active region, and
the fifth semiconductor layer is provided at the termination region side of the sixth semiconductor layer, the fifth semiconductor being apart from the sixth semiconductor layer.

5. The device according to claim 4, wherein
the sixth semiconductor layer is provided between the second semiconductor layer and the fifth semiconductor layer.

6. The device according to claim 1, wherein
the semiconductor part further includes a seventh semiconductor layer of the first conductivity type,
the seventh semiconductor layer is provided between the first semiconductor layer and the fourth semiconductor layer, and
the seventh semiconductor layer includes a first-conductivity-type impurity with a higher concentration than a concentration of a first-conductivity-type impurity in the first semiconductor layer.

7. The device according to claim 6, wherein
the seventh semiconductor layer extends from the active region to the termination region between the fourth semiconductor layer and the fifth semiconductor layer.

8. The device according to claim 7, wherein
the fifth semiconductor layer is apart from the seventh semiconductor layer with a portion of the first semiconductor layer interposed.

9. The device according to claim 1, wherein
the semiconductor part further includes an eighth semiconductor layer of the first conductivity type, the eighth semiconductor layer being provided at the front side of the semiconductor part and being apart from the sixth semiconductor layer, the sixth semiconductor layer being provided between the active region and the eighth semiconductor layer, the eighth semiconductor layer including a first-conductivity-type impurity with a higher concentration than a concentration of a first-conductivity-type impurity in the first semiconductor layer, and
the first semiconductor layer includes a portion provided between the sixth semiconductor layer and the eighth semiconductor layer, the fifth semiconductor layer being provided between the portion of the first semiconductor layer and the fourth semiconductor layer.

10. The device according to claim 9, wherein
the fifth semiconductor layer has a plate-like shape extending in the first direction.

11. The device according to claim 9, wherein
the semiconductor part further includes a ninth semiconductor layer of the second conductivity type,
the ninth semiconductor layer is provided between the sixth and eighth semiconductor layers at the front side of the semiconductor part, and
the fifth semiconductor layer is provided between the fourth semiconductor layer and the ninth semiconductor layer in the second direction.

12. The device according to claim 11, wherein
the ninth semiconductor layer surrounds the active region.

13. The device according to claim 11, further comprising:
a third electrode provided on the eighth semiconductor layer; and
a fourth electrode provided on the ninth semiconductor layer,
the second electrode, the third electrode, and the fourth electrode being apart from each other,
the third electrode being electrically connected to the eighth semiconductor layer, the fourth electrode being electrically connected to the ninth semiconductor layer.

14. The device according to claim 1, wherein
the first semiconductor layer includes a first region and a second region, the second region being provided between the first electrode and the first region and including a first-conductivity-type impurity with a higher concentration than a concentration of a first-conductivity-type impurity in the first region, and
the fifth semiconductor layer is provided in the second region.

15. The device according to claim 14, wherein
the fourth semiconductor layer extends from the active region to the termination region between the first electrode and the second region of the first semiconductor layer.

16. The device according to claim 15, wherein
the first-conductivity-type impurity in the first semiconductor layer has a distribution in the second direction, the distribution including a plurality of concentration peaks in the second region, and
the plurality of concentration peaks includes first and second peaks, the first peak being positioned between the fourth semiconductor layer and the fifth semiconductor layer, the second peak being positioned between the first region and the fifth semiconductor layer, a first concentration of the first-conductivity-type impurity at the first peak being greater than a second-conductivity-type impurity concentration of the fifth semiconductor layer, the second concentration of the first-conductivity-type impurity at the second peak being less than the second-conductivity-type impurity concentration of the fifth semiconductor layer.

17. The device according to claim 1, further comprising:
a resin layer provided at the front side of the semiconductor part, the resin layer covering the termination region.

* * * * *